US 6,699,790 B2

(12) United States Patent
Kim et al.

(10) Patent No.: US 6,699,790 B2
(45) Date of Patent: Mar. 2, 2004

(54) SEMICONDUCTOR DEVICE FABRICATION METHOD FOR FILLING HIGH ASPECT RATIO OPENINGS IN INSULATORS WITH ALUMINUM

(75) Inventors: Byung-Hee Kim, Seoul (KR); Jong-Myeong Lee, Sungnam (KR); Myoung-Bum Lee, Seoul (KR); Gil-Heyun Choi, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 99 days.

(21) Appl. No.: 10/035,807

(22) Filed: Jan. 4, 2002

(65) Prior Publication Data

US 2002/0098682 A1 Jul. 25, 2002

(30) Foreign Application Priority Data

Jan. 5, 2001 (KR) .............................. 2001-647

(51) Int. Cl.[7] .............................................. H01L 21/443
(52) U.S. Cl. ...................... 438/688; 438/653; 438/656; 438/675
(58) Field of Search ................. 438/627, 643, 438/648, 653, 656, 675, 685, 688

(56) References Cited

U.S. PATENT DOCUMENTS

| | | | | |
|---|---|---|---|---|
| 5,147,819 A | * | 9/1992 | Yu et al. ..................... | 438/662 |
| 5,484,747 A | * | 1/1996 | Chien ......................... | 438/644 |
| 5,877,087 A | * | 3/1999 | Mosely et al. ............... | 438/656 |
| 6,189,209 B1 | * | 2/2001 | Saran .......................... | 29/852 |
| 6,355,558 B1 | * | 3/2002 | Dixit et al. ................. | 438/642 |

FOREIGN PATENT DOCUMENTS

| | | |
|---|---|---|
| EP | 509835 | 10/1992 |
| JP | 5-259132 | 10/1993 |
| KR | 98-11890 | 4/1998 |

OTHER PUBLICATIONS

Young–Ho Park, "Method for Filling Up Contact Hole of Semiconductor Device," English Translation of Published Korean Patent Application KR 98–11890 A, Apr. 1998.*

* cited by examiner

Primary Examiner—Carl Whitehead, Jr.
Assistant Examiner—Stephen W. Smoot
(74) Attorney, Agent, or Firm—Lee & Sterba, P.C.

(57) ABSTRACT

A semiconductor device fabrication method having a recess region in an insulation layer on a silicon substrate, includes the steps of depositing a barrier metal on an entire surface of the insulation layer, filling the recess region with an oxide layer, removing the barrier metal on an upper side of the insulation layer, removing the oxide layer in the recess region and exposing the barrier metal of the recess region, depositing a CVD-Al layer on the barrier metal, and depositing a PVD-Al layer on the CVD-Al layer and re-flowing the PVD-Al layer. The fabrication method of a semiconductor integrated circuit according to the present invention selectively removes a barrier metal in the outside of the recess region to expose the insulation layer to the air, and deposits the CVD-Al layer and the PVD-Al layer, which results in controlling abnormal growth of the CVD-Al metal.

7 Claims, 6 Drawing Sheets

SEMICONDUCTOR DEVICE FABRICATION METHOD FOR FILLING HIGH ASPECT RATIO OPENINGS IN INSULATORS WITH ALUMINUM

BACKGROUND OF THE INVENTION

1. Field of the Invention

The present invention refers to a semiconductor device fabrication method. More particularly, the present invention relates to a fabrication method for metal lines in a semiconductor integrated circuit.

2. Description of the Related Art

A typical semiconductor device includes transistors, resistors and capacitors, and requires metal lines for fabricating a semiconductor device on a silicon wafer. Because the metal lines transmit electric signals, it is necessary for the metal lines to have a low electric resistance. Ideally, metal lines are also inexpensive and highly reliable. Aluminum (Al) is one of several materials that satisfy the above-described requirements. Accordingly, an aluminum layer is widely used as a metal line.

Further, the greater the degree of integration of a semiconductor device, the more narrow each metal line is required to be. Moreover, the thinner a metal line is the smaller the size a contact hole becomes. As the size of the contact hole decreases, an aspect ratio is increased. An increase in the aspect ratio increases the difficulty of filling the contact hole with aluminum. Therefore, the technology capable of completely filling the contact hole with aluminum becomes increasingly important as the degree of integration of a semiconductor device increases.

One technology that has the potential for completely filling a contact hole, having a high aspect ratio, with aluminum is a chemical vapor deposition aluminum (CVD-Al) process. In general, there are two types of CVD-Al processes. The first type is a blanket aluminum process. The second type is a selective aluminum process.

The blanket aluminum process is one technology, which utilizes a characteristic of excellent step coverage in aluminum metals. The blanket Al process deposits aluminum metals on the entire surface of a wafer to fill completely a contact hole. However, as is generally known, the CVD-Al process possesses a peculiar growth characteristic beyond a certain thickness, thereby generating a rougher wafer surface and not filling a small contact hole.

Alternatively, the selective Al process, which utilizes a difference in a growth rate between an insulation layer and a conductive layer, may only be employed in a limited area, such as a via contact. The selective Al process may not be employed as a metal contact depositing a barrier metal.

Therefore, new technology for lowering contact resistance and metal line resistance and for completely filling a contact hole is necessary to present day and future integrated semiconductor devices.

Referring to FIG. 1A, using a conventional preferential metal deposition (PMD) process, an insulation layer 3 is deposited on a silicon substrate 1. After generating a contact hole 35, a barrier metal is deposited on the contact hole 35 and the insulation layer 3. Then, an anti-nucleation layer (ANL) 7 is generated on the surface of the barrier metal 5, except at the location of the contact hole 35.

A physical vapor deposition (PVD) process, or a CVD process, in a condition of poor conformability, deposits an oxidation metal such as aluminum (Al), zirconium (Zr), titanium (Ti), strontium (Sr), magnesium (Mg), barium (Ba), calcium (Ca), cerium (Ce), or yttrium (Y), etc. Subsequently, either the PVD process or the CVD process is utilized to oxidize the deposited metal layer by exposing the layer to air or by use of an oxygen plasma process to generate the ANL layer 7.

Referring to FIG. 1B to FIG. 1D, a CVD-Al process is used to deposit a metal layer 9 selectively in the contact hole 35. Subsequently, a physical vapor deposition aluminum (PVD-Al) process is used to deposit an aluminum layer 11 and the contact hole 35 is filled using a re-flow process.

However, referring to FIG. 3A, the above-mentioned technology has a problem in generating abnormal growth patterns, such as a whisker type CVD-Al 15 when the ANL layer 7 is not entirely deposited on the surface of the barrier metal 5. Use of such a conventional CVD-Al creates problems in the following process, which results in lowered yields.

On the contrary, referring to FIG. 3B, the abnormal growth of the CVD-Al does not occur when the ANL layer 7 is deposited on the entire surface of the barrier metal 5. The results, as illustrated in FIG. 3B, represent a significant improvement over those of the prior art and may be achieved by use of the present invention.

As depicted in FIG. 4, when an ANL layer does not cover completely a barrier metal because of surface roughness or grains of the barrier metal, the CVD-Al is grown abnormally and selectively in the area of the barrier metal. In FIG. 4, the barrier metal is a conductive layer consisting of titanium Ti or titanium nitride TiN.

SUMMARY OF THE INVENTION

In an effort to overcome at least some of the above-described problems, a feature of a preferred embodiment of the present invention provides a fabrication method in a semiconductor integrated circuit controlling an abnormal growth of a CVD-Al.

The preferred embodiments of the present invention provide a semiconductor device fabrication method having a recess region in an insulation layer on a silicon substrate, including depositing a barrier metal, on the entire surface of the insulation layer, filling the recess region with an oxide layer, removing the barrier metal on an upper side of the insulation layer, removing the oxide layer in the recess region and exposing the barrier metal of the recess region, depositing a CVD-Al layer on the barrier metal, and depositing a PVD-Al layer on the CVD-Al layer and re-flowing the PVD-Al layer.

BRIEF DESCRIPTION OF THE DRAWINGS

For a more complete understanding of the present invention and the features and advantages thereof, reference is now made to the following detailed description taken in conjunction with the accompanying drawings, in which like reference numerals denote like elements, and in which.

DETAILED DESCRIPTION OF THE INVENTION

Korean Patent Application No. 2001-647, filed on Jan. 5, 2001, and entitled: "Semiconductor Device Fabrication Method," is incorporated by reference herein in its entirety.

Reference will now be made in detail to preferred embodiments of the present invention, an example of which is illustrated in the accompanying drawings.

FIG. 2A to FIG. 2E illustrate cross-sectional diagrams of a semiconductor device illustrating a metal line fabrication method in a semiconductor integrated circuit according to a preferred embodiment of the present invention.

After generating an insulation layer 3 on a silicon substrate 1, a predetermined area of the insulation layer 3 is etched to pattern the insulation layer 3 to have a recess region. The above etching process may be a common etching process. The recess region may be a contact hole exposing a certain area of the silicon substrate 1, and a groove that is shallower in depth than the insulation layer 3. In the case of a damascene process, the recess region is a groove.

Figure 1A:
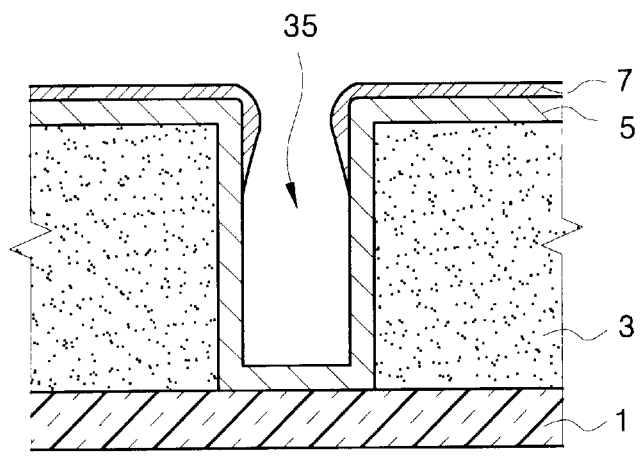
FIG. 1A to FIG. 1D illustrate cross-sectional diagrams of a semiconductor device illustrating a conventional metal line fabrication method in a semiconductor integrated circuit.
Figure 1B:
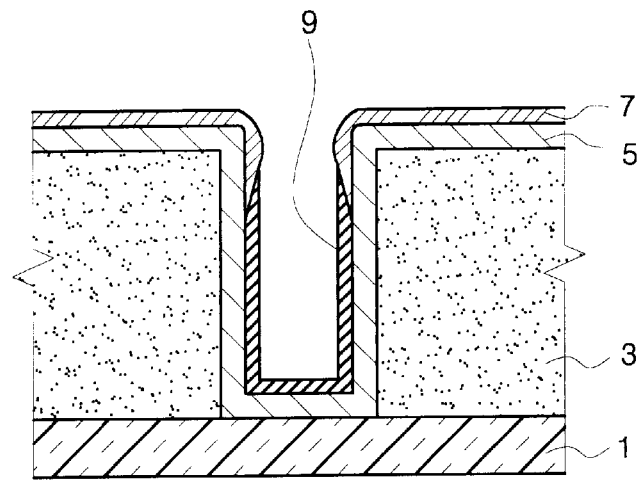
Figure 1C:
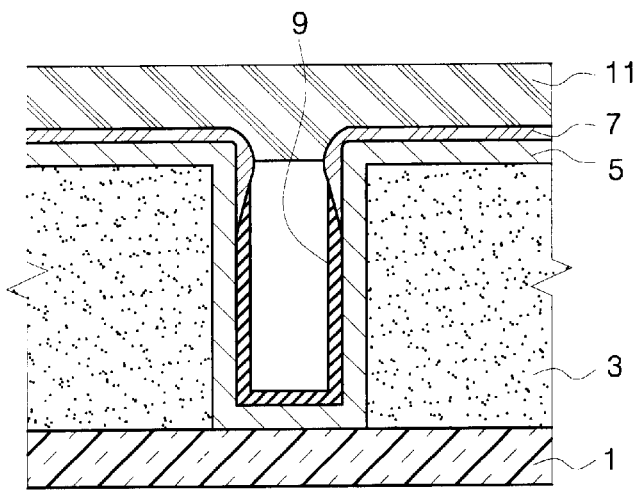
Figure 1D:
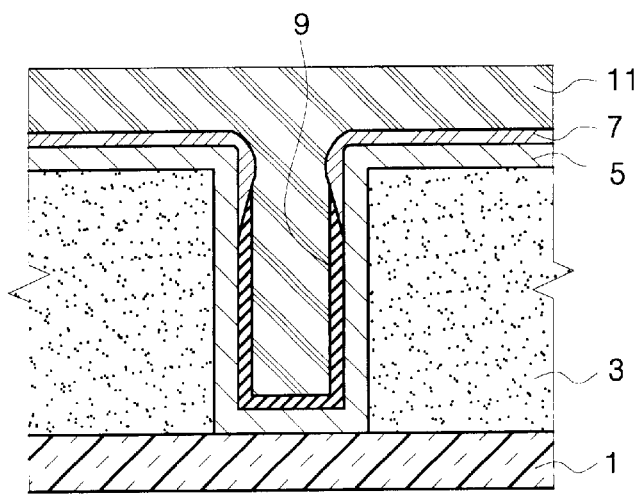
Figure 2A:
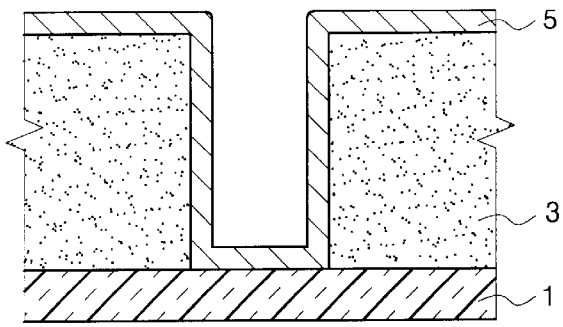
FIG. 2A to FIG. 2E illustrate cross-sectional diagrams of a semiconductor device illustrating a metal line fabrication method in a semiconductor integrated circuit according to a preferred embodiment of the present invention.

Referring to FIG. 2A, a barrier metal 5 (or a wetting layer 5) is generated on the patterned insulation layer 3. When the recess region is a contact hole exposing a source/drain area of a transistor on the silicon substrate 1, it is preferable to form an ohmic metal layer on the patterned insulation layer 3 before the barrier metal 5 is generated.

The barrier metal 5 comprises one of the metals such as titanium (Ti), titanium nitride (TiN), Ti/TiN compound, tantalum (Ta), tantalum nitride (TaN) or Ta/TaN compound. Commonly, a sputtering process generates the barrier metal 5.

Figure 2B:
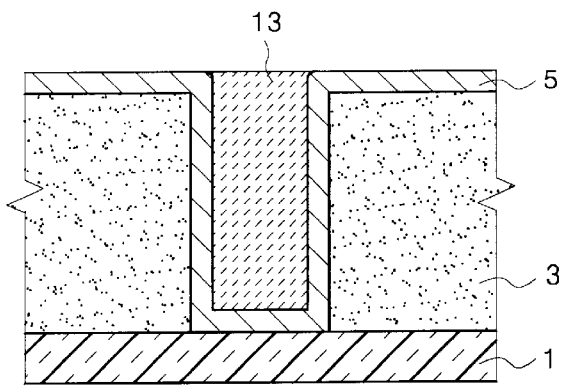

Referring to FIG. 2B, an oxide 13 as an insulation layer, such as a silicate on glass (SOG) or a flowable oxide, fills an interior of the contact hole forming the recess region. Any oxide insulation material may be the filler material. It is preferable that the oxide fills only the recess region, and an etch rate of the filler material 13 is greater than an etch rate of the insulation layer 3.

Figure 2C:
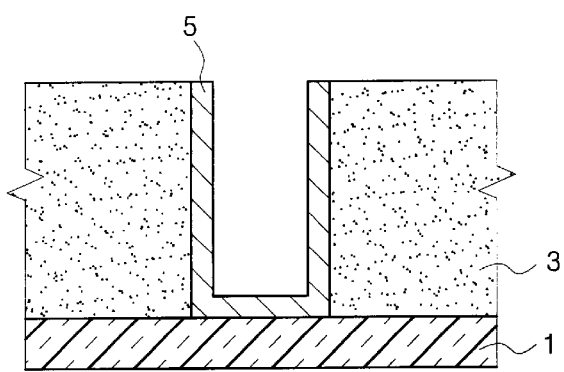

Referring to FIG. 2C, a chemical mechanical polishing (CMP) process or an etch-back process removes the top portions of the barrier metal 5 (or of the wetting layer 5), except the barrier metal in the interior of the contact hole. The CMP process also removes the top portion of the insulation material in the interior of the contact hole. Therefore, the upper side of the insulation layer 3 becomes exposed to the air.

The following wet etch process selectively lifts off the oxide material filling the interior of the contact hole and exposes the barrier metals 5 on the sidewall and the bottom of the recess region to the air.

Figure 2D:
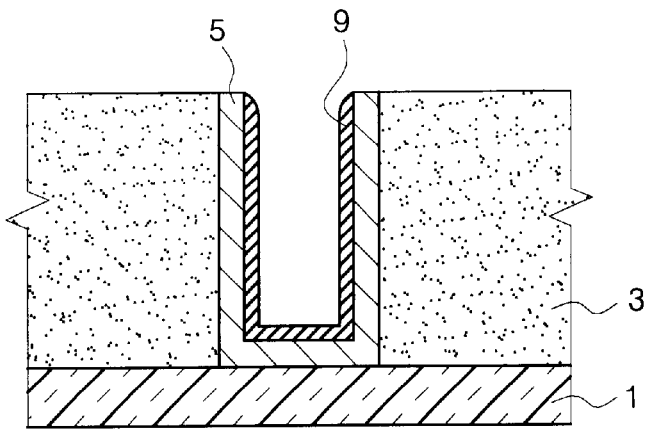

Referring to FIG. 2D, a CVD-Al 9 process makes an aluminum Al layer 11 grow on only the barrier metal 5. The CVD-Al 9 is not grown on the insulation layer 3 outside of the contact hole because the insulation layer 3 is an oxide layer.

Figure 2E:
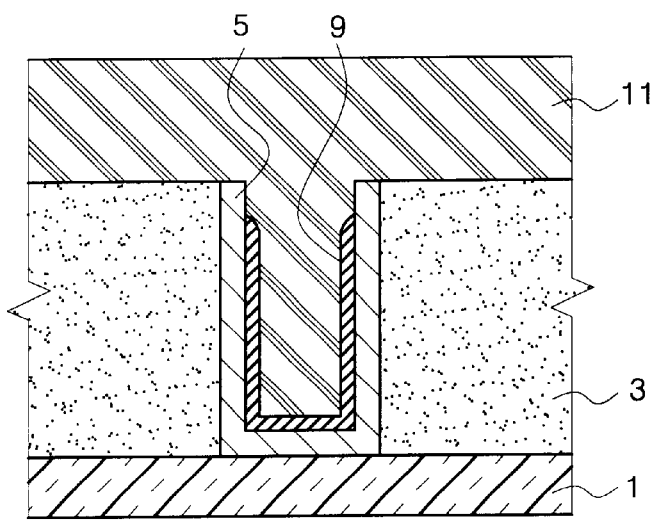
Figure 3A:
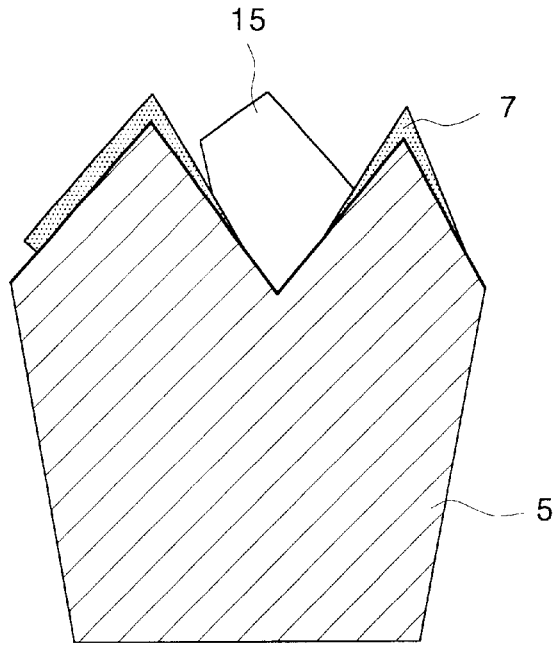
FIG. 3A illustrates an abnormal growing of a CVD-Al metal when an ANL layer does not completely cover a barrier metal.
Figure 3B:
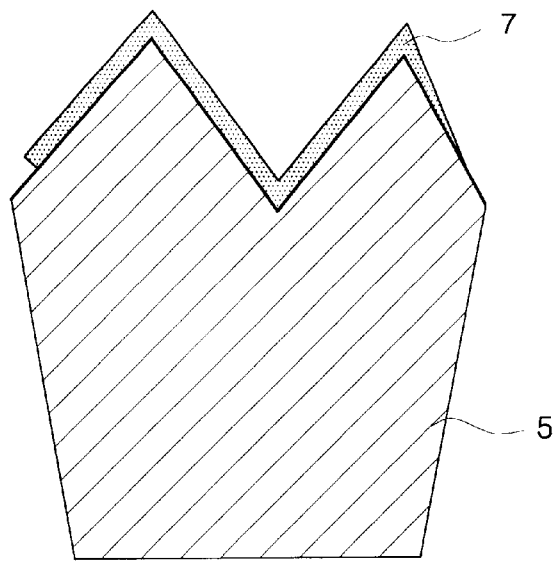
FIG. 3B illustrates an ANL layer and the barrier metal where, as opposed to FIG. 3A, the ANL layer completely covers a barrier metal.
Figure 4:
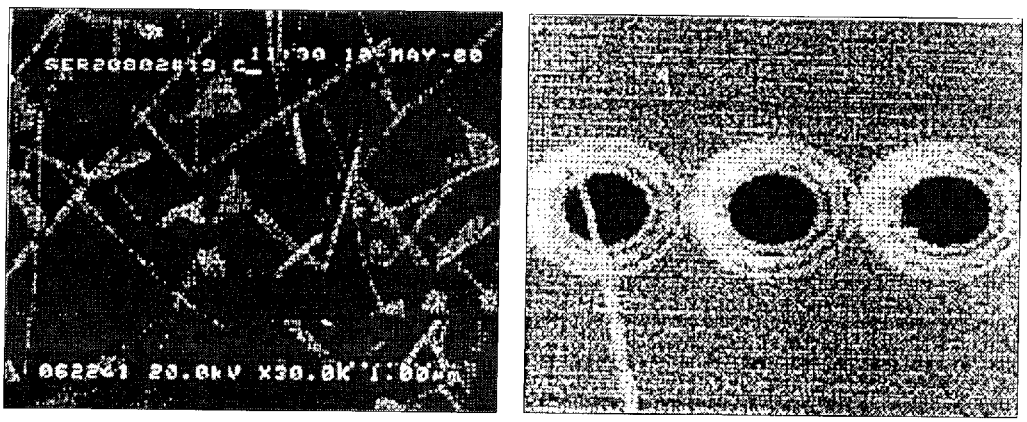
FIG. 4 is a photograph taken by a scanning electron microscope depicting the growth of a whisker type CVD-Al metal.

Referring to FIG. 2E, a PVD-Al process forms an aluminum layer 11 (or an aluminum alloy layer 11) additionally to cover the CVD-Al layer 9. Finally, re-flowing the aluminum layer 11 (or the aluminum alloy layer 11) completes the fabrication of the metal lines of a semiconductor integrated circuit.

Because a degree of defect of an aluminum layer depends on a migration degree of a deposited aluminum atom, and the degree of defect has an influence upon the following process, it is preferable that one of the metals Ti, TiN, Ti/TiN, Ta, TaN or Ta/TaN is deposited before the PVD-Al process is performed.

The metals, Ti, TiN, Ti/TiN, Ta, TaN or Ta/TaN, that have the same chemical composition as the barrier metal 5, inhibit an atomic migration of the PVD-Al layer so that a smaller degree of defect of the PVD-Al layer is obtained.

It is preferable that a thickness of the deposited metals, Ti, TiN, Ti/TiN, Ta, TaN or Ta/TaN, is less than about 100 Å.

A fabrication method in a semiconductor integrated circuit according to the present invention selectively removes the barrier metal layer 5 outside of the contact hole to expose the insulation layer 3 to the air, and sequentially deposits the CVD-Al layer and the PVD-Al layer, which results in controlling abnormal growth of the CVD-Ai metal.

While the invention has been particularly shown and described with reference to preferred embodiments thereof, it will be understood by those of ordinary skill in the art that the foregoing and other changes in form and details may be made herein without departing from the spirit and scope of the invention as defined by the following claims.

What is claimed is:

1. A fabrication method of a semiconductor device having a recess region in an insulation layer on a silicon substrate, the fabrication method comprising:

depositing a barrier metal on the entire surface of the insulation layer;

filling the recess region with an oxide layer;

removing the barrier metal on an upper side of the insulation layer;

removing the oxide layer in the recess region and exposing the barrier metal of the recess region;

depositing a CVD-Al layer on the barrier metal;

depositing a metal selected from the group consisting of Ti, TiN, Ti/TiN, Ta, TaN and Ta/TaN on the CVD-Al layer; and depositing a PVD-Al layer on the metal and re-flowing the PVD-Al layer.

2. The fabrication method of a semiconductor device having a recess region in an insulation layer on a silicon substrate as claimed in claim 1, wherein the barrier metal is selected from the group consisting of titanium (Ti), titanium nitride (TiN), Ti/TiN compound, tantalum (Ta), tantalum nitride (TaN) and Ta/TaN compound.

3. The fabrication method of a semiconductor device having a recess region in an insulation layer on a silicon substrate as claimed in claim 1, further comprising forming an ohmic metal layer prior to depositing the barrier metal.

4. The fabrication method of a semiconductor device having a recess region in an insulation layer on a silicon substrate as claimed in claim 1, wherein an etch rate of the oxide layer is greater than an etch rate of the insulation layer.

5. The fabrication method of a semiconductor device having a recess region in an insulation layer on a silicon substrate as claimed in claim 1, wherein the oxide layer is selected from the group consisting of silicate on glass (SOG) and flowable oxide.

6. The fabrication method of a semiconductor device having a recess region in an insulation layer on a silicon substrate as claimed in claim 1, wherein removing the barrier metal on the upper side of the insulation layer employs either a chemical mechanical polishing CMP process or an etch-back process.

7. The fabrication method of a semiconductor device having a recess region in an insulation layer on a silicon substrate as claimed in claim 1, wherein a thickness of the deposited metal selected from the group consisting of Ti, TiN, Ti/TiN, Ta, TaN and Ta/TaN is less than about 100 Å.

* * * * *